(12) United States Patent
Yi

(10) Patent No.: US 6,708,255 B2
(45) Date of Patent: Mar. 16, 2004

(54) VARIABLE INPUT/OUTPUT CONTROL DEVICE IN SYNCHRONOUS SEMICONDUCTOR DEVICE

(75) Inventor: Seung-Hyun Yi, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 255 days.

(21) Appl. No.: 10/029,948

(22) Filed: Dec. 31, 2001

(65) Prior Publication Data

US 2002/0087750 A1 Jul. 4, 2002

(30) Foreign Application Priority Data

Dec. 30, 2000 (KR) .......................................... 2000-87069

(51) Int. Cl.[7] .............................................. G06F 12/00
(52) U.S. Cl. ....................... 711/137; 711/104; 712/207; 365/230.03
(58) Field of Search .......................... 711/104–105, 137; 712/205–207; 365/189.05, 230.02–230.06

(56) References Cited

U.S. PATENT DOCUMENTS

| | | | | |
|---|---|---|---|---|
| 5,822,577 A | * | 10/1998 | Ekanadham et al. | ......... 712/240 |
| 6,351,427 B1 | * | 2/2002 | Brown | ................... 365/230.03 |
| 6,430,092 B2 | * | 8/2002 | Nanba | ................... 365/189.11 |
| 2002/0024882 A1 | * | 2/2002 | Ikeda | ......................... 365/233 |
| 2002/0071316 A1 | * | 6/2002 | Manning | ................ 365/189.05 |
| 2002/0105836 A1 | * | 8/2002 | Benedix | ................ 365/189.05 |

\* cited by examiner

*Primary Examiner*—Nasser Moazzami
(74) *Attorney, Agent, or Firm*—Jacobson Holman PLLC

(57) ABSTRACT

A variable input/output control device in a synchronous semiconductor memory device including a plurality of first prefetch units to prefetch data from an input buffer, a plurality of second prefetch units to prefetch data from a memory core and a control signal generator for generating a control signal in response to command signals to select one of the plurality of first prefetch units and one of the plurality of second prefetch units.

11 Claims, 4 Drawing Sheets

VARIABLE INPUT/OUTPUT CONTROL DEVICE IN SYNCHRONOUS SEMICONDUCTOR DEVICE

FIELD OF THE INVENTION

The present invention relates to a semiconductor memory device and, more particularly, to a semiconductor memory device having a variable input/output control device.

DESCRIPTION OF THE PRIOR ART

Generally, a memory has a fixed prefetch way, which is an input/output way so that an SDRAM fabricated with a 1-bit prefetch way cannot be used as a DDR SDRAM using a 2-bit prefetch way. Also, the DDR SDRM fabricated with a 2-bit prefetch way cannot be used as a SDRAM using a 1-bit prefetch way. Accordingly, utility of the memory is low.

SUMMARY OF THE INVENTION

It is, therefore, an object of the present invention to provide a semiconductor memory device having a variable input/output control device.

In accordance with an aspect of the present invention, there is provided a variable input/output control device in a synchronous semiconductor memory device, comprising a plurality of first prefetch units to prefetch data from an input buffer; a plurality of second prefetch units to prefetch data from a memory core; and a control signal generating means for generating a control signal in response to command signals to select one of the plurality of first prefetch units and one of the plurality of second prefetch units.

In accordance with another aspect of the present invention, there is provided a variable input/output control device in a synchronous semiconductor memory device, comprising a first N-bit prefetch unit to prefetch data from an input buffer; a second N-bit prefetch unit to prefetch data from a memory core; and a means for determining the number of prefetch bits in the first and second N-bit prefetch units in response to a command signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, a semiconductor memory device according to the present invention will be described in detail referring to the accompanying drawings.

Figure 1A:
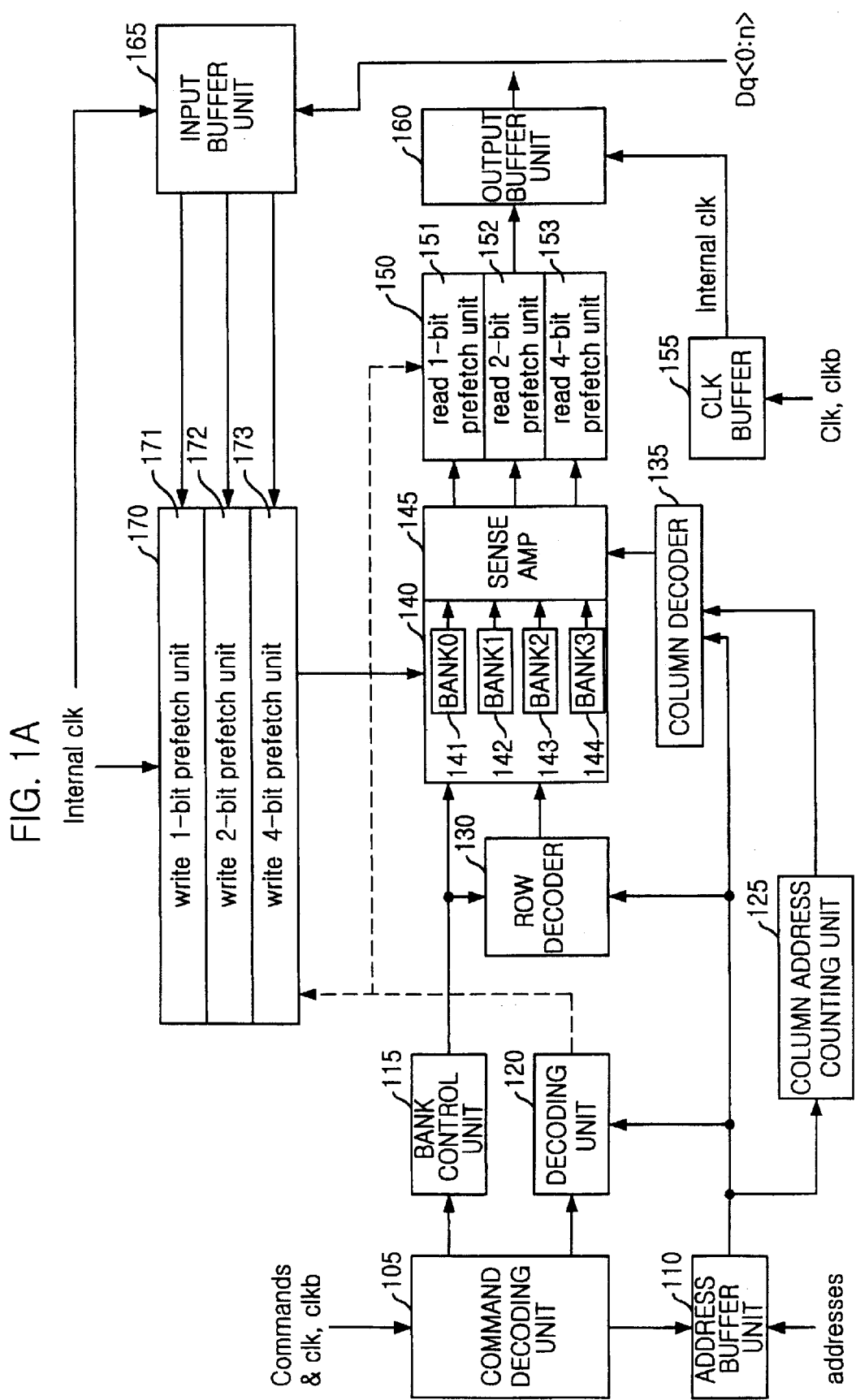
FIG. 1A is a block diagram illustrating a memory configuration having three kinds of prefetch units according to a first embodiment of the present invention.

FIG. 1A is a block diagram illustrating a memory configuration having three kinds of prefetch units according to a first embodiment of the present invention.

Referring to FIG. 1A, when command signals and clock signals (clk and clkb) are inputted into a command decoding unit 105, the command signals are synchronized with the clock signals and then the command signals are outputted into a bank control unit 115, a decoding unit 120 and an address buffer unit 110. The bank control unit 115 controls each bank 141, 142, 143 and 144 and a row decoder 130 in response to the command signals. The decoding unit 120 sets a read prefetch unit 150 and a write prefetch unit 170 before a memory is accessed for read or write. Address signals outputted from an address buffer unit 110 are inputted into the decoding unit 120, the row decoder 130, a column decoder 135 and a column address counting unit 125. Data signals read out from each bank 141, 142, 143 and 144 are amplified in a sense amplifier 145 and inputted into the read prefetch unit 150. The data signals in the read prefetch unit 150 are inputted into an output buffer unit 160 with internal clock signals outputted from a clock buffer 155.

Also, the internal clock signals are inputted into the write prefetch unit 170 and an input buffer unit 165. The data signals outputted from the input buffer 165 are stored synchronized with the internal clock signals in each bank of the bank unit 140 through the write prefetch unit 170.

The decoding unit 120 outputs a prefetch control signal for enabling one prefetch unit among the three prefetch units.

Firstly, an operation when a 1-bit prefetch unit is enabled will be described.

When a write operation is performed to write data to the memory, one data is written in the memory per one clock cycle because of the 1-bit prefetch unit. Also, when a read operation is performed to read data from the memory, one data is outputted per one clock cycle. This operation is identical to that of a general synchronous DRAM and a synchronous SRM.

The operation when a 2-bit prefetch unit is enabled is identical to that of the DDR SDRM. The read/write operation is performed at a rising edge and a falling edge of the external clock. The 2-bit prefetch operation is to convert two serial data into two parallel data or to convert two parallel data into two serial data.

When a 4-bit prefetch unit is enabled, a speed inputting or outputting data is different from a speed of the internal operation by as much as four times. Namely, the 4-bit prefetch operation is to convert four serial data into four parallel data or four parallel data into four serial data. This operation is shown in a RAMBUS DRM and a DDR-II SDRAM.

Figure 1B:
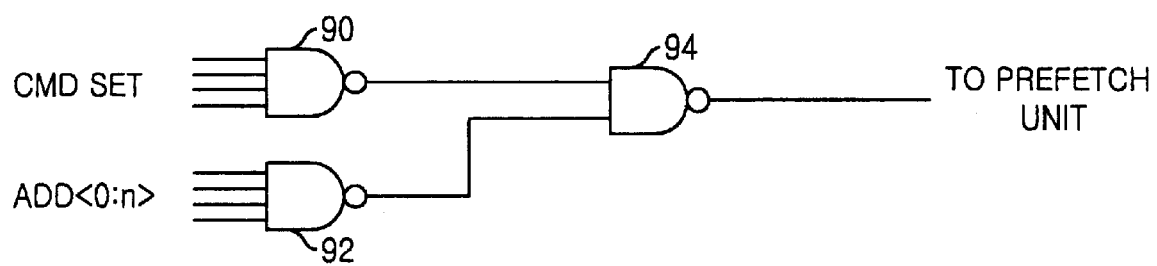
FIG. 1B is a circuit diagram illustrating the decoding unit of FIG. 1A according to the present invention.

FIG. 1B is a circuit diagram illustrating the decoding unit of FIG. 1A according to the present invention. The decoding unit includes a first NAND gate 90 receiving command signals, a second NAND gate 92 receiving address signals and a third NAND gate 94 receiving outputs of the first and second NAND gates and outputting the control signal.

Figure 2:
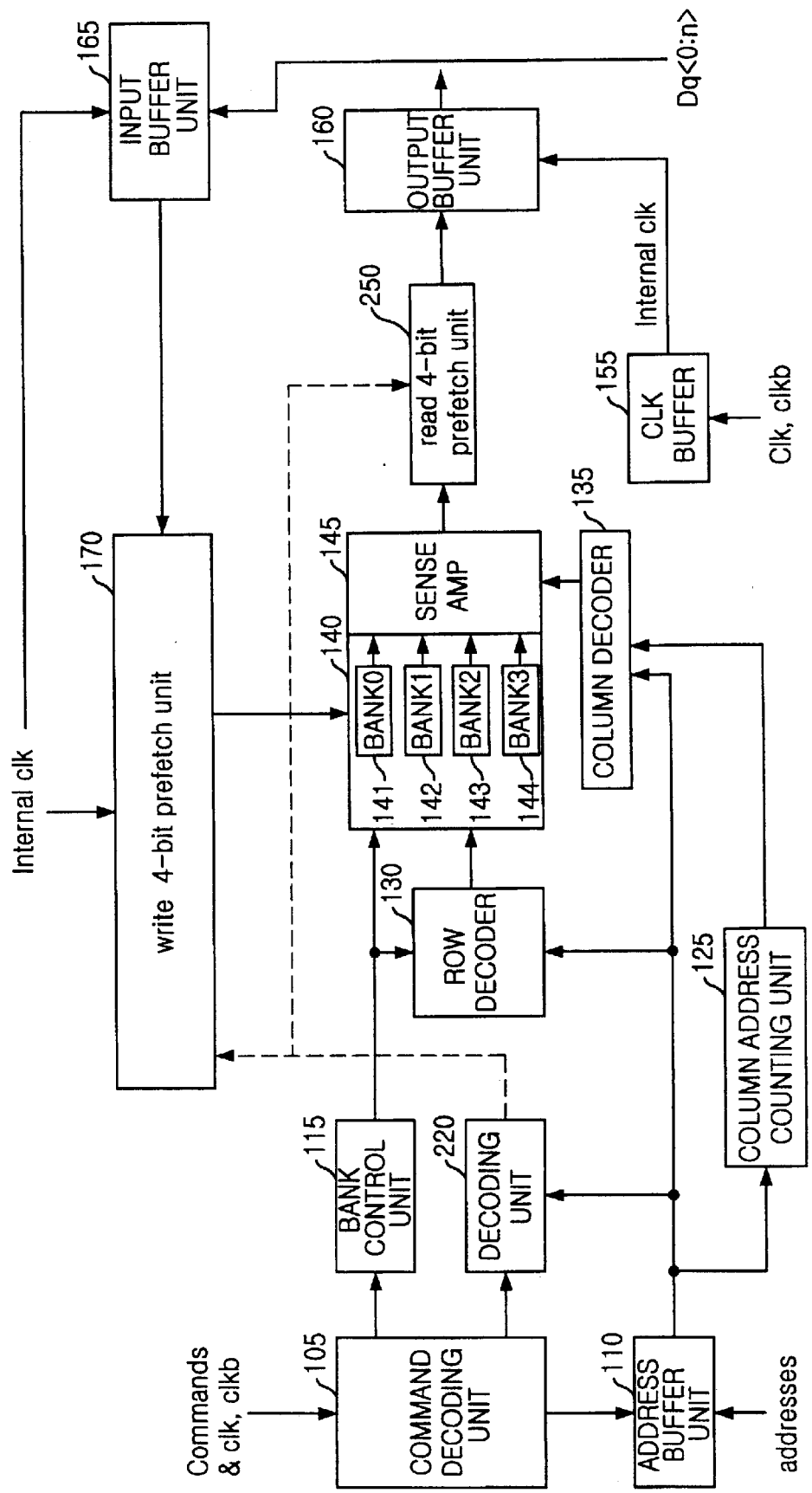
FIG. 2 is a block diagram illustrating a memory configuration having a 4-bit prefetch unit according to a second embodiment of the present invention.

FIG. 2 is a block diagram illustrating a memory configuration having the 4-bit prefetch unit according to a second embodiment of the present invention.

The configuration and operation are similar to that of the first embodiment of the present invention. Differences are that the memory has a single 4-bit prefetch unit 250 and a portion of the 4-bit prefetch unit is selected by a prefetch control signal outputted from the decoding unit 120. Namely, if the entire 4-bit prefetch unit is selected in response to the control signal, the 4-bit prefetch operation is performed. If half of the 4-bit prefetch unit is selected in response to the control signal, a 2-bit prefetch operation is performed. Also, if one quarter of the 4-bit prefetch operation is selected, a 1-bit operation is performed.

Figure 3:
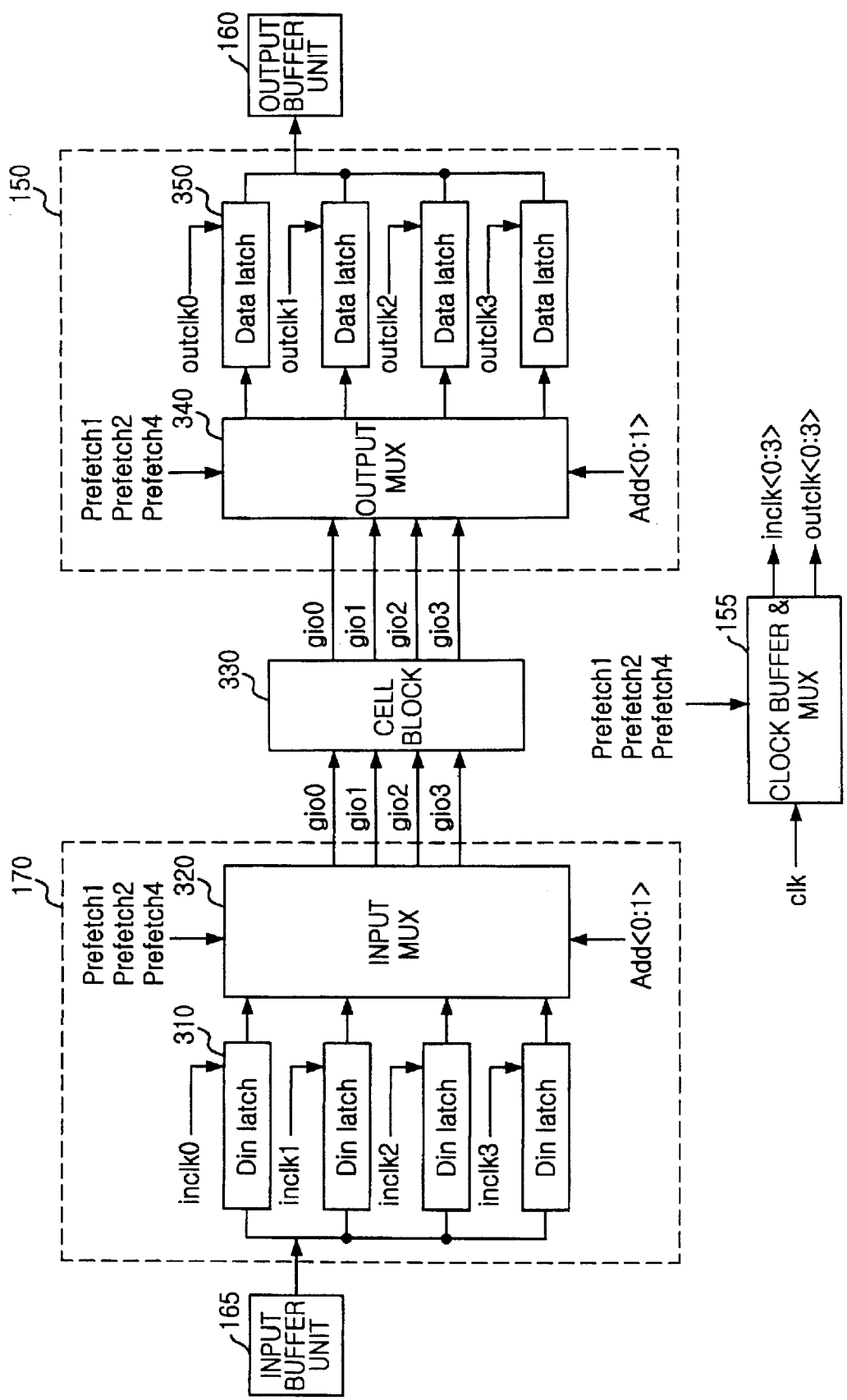
FIG. 3 is a detailed block diagram of the prefetch units of FIG. 2 to select a portion of the 4-bit prefetch unit according to the present invention.

FIG. 3 is a detailed block diagram of the prefetch units of FIG. 2 to select a portion of the 4-bit prefetch unit according to the present invention.

Data signals outputted from the input buffer unit 165 are inputted into a data input latch unit 310 and the data signal of the data input latch enabled in response to the in-clock signals (inclk<0:3>) is outputted. An input multiplexer 320 for inputting the data signal outputted from the data input latch unit 310 into a cell block 330 selects a global input/output line (gio) by using the address signal (Add<0:n>) as a control signal. An output multiplexer 340 provides data signals outputted through the global input/output line (gio) into a data output latch unit 350 and the data signal of the data output latch enabled in response to the out-clock signals (outclk<0:3>) is inputted into the output buffer unit 160.

In the 1-bit prefetch operation, only the in-clock signal inclk0 and the out-clock signal outclk0 are used. Also, one data input latch and one data output latch are used.

In the 2-bit prefetch operation, the in-clock signals inclk0 and inclk1 in the data input latch unit 310 and the out-clock signals outclk0 and outclk1 in the data output latch unit 350 are used. Also, two latches for the data input latch unit 310 and the data output latch unit 350 are used respectively.

In the 4-bit prefetch operation, all in-clock signals (inclk<0:3>) and all out-clock signals (outclk<0:3>) are used and, also, all latches of the data input/output latch units 320 and 350 are used.

Accordingly, as a usage of the prefetch is the memory input/output terminals is improved to support variable usage, the memory can be variably used in many applications.

While the present invention has been described with respect to the particular embodiments, it will be apparent to those skilled in the art that various changes and modifications may be made without departing from the spirit and scope of the invention as defined in the following claims.

What is claimed is:

1. A variable input/output control device in a synchronous semiconductor memory device, comprising:
    a plurality of first prefetch units to prefetch data from an input buffer;
    a plurality of second prefetch units to prefetch data from a memory core; and
    a control signal generating means for generating a control signal in response to command signals to select one of the plurality of first prefetch units and one of the plurality of second prefetch units.

2. The variable input/output control device as recited in claim 1, wherein the control signal generating means includes a logic circuit for combining the command signals.

3. The variable input/output control device as recited in claim 2, wherein the control signal generating means further includes a logic circuit for combining address signals.

4. The variable input/output control device as recited in claim 2, wherein the control signal generating means is a first decoding unit for receiving the command signals and outputting the control signal in response to a clock signal.

5. The variable input/output control device as recited in claim 4, wherein the first decoding unit further receives address signals.

6. The variable input/output control device as recited in claim 1, wherein the second plurality of prefetch units includes at least one of a 1-bit prefetch unit, a 2-bit prefetch unit and a 4-bit prefetch unit.

7. A variable input/output control device in a synchronous semiconductor memory device, comprising:
    a first N-bit prefetch unit to prefetch data from an input buffer;
    a second N-bit prefetch unit to prefetch data from a memory core; and
    means for determining the number of prefetch bits in the first and second N-bit prefetch units in response to a command signal.

8. The variable input/output control device as recited in claim 7, wherein the means for determining includes a logic circuit for combining a plurality of command signals.

9. The variable input/output control device as recited in claim 8, wherein the means for determining further includes a logic circuit for combining address signals.

10. The variable input/output control device as recited in claim 8, wherein the means for determining includes a first decoding unit for receiving the plurality of command signals and outputting control signals in response to a clock signal.

11. The variable input/output control device as recited in claim 10, wherein the first decoding unit further receives address signals.

* * * * *